United States Patent
Yen et al.

(10) Patent No.: US 7,791,949 B2
(45) Date of Patent: Sep. 7, 2010

(54) REFRESH METHOD FOR A NON-VOLATILE MEMORY

(75) Inventors: Ching-Fang Yen, Taipei County (TW); Che-Heng Lai, Kaohsiung (TW); Chih-Yuan Cheng, Taipei (TW)

(73) Assignee: AMIC Technology Corporation, Science-Based Industrial Park, Hsin-Chu (TW)

(*) Notice: Subject to any disclaimer, the term of this patent is extended or adjusted under 35 U.S.C. 154(b) by 155 days.

(21) Appl. No.: 12/329,626

(22) Filed: Dec. 7, 2008

(65) Prior Publication Data
US 2010/0067295 A1    Mar. 18, 2010

(30) Foreign Application Priority Data
Sep. 15, 2008    (TW) .............................. 97135328 A

(51) Int. Cl.
*G11C 16/00* (2006.01)

(52) U.S. Cl. ................................... 365/185.25; 365/222
(58) Field of Classification Search ............. 365/185.02
See application file for complete search history.

(56) References Cited

U.S. PATENT DOCUMENTS

| | | | | |
|---|---|---|---|---|
| 5,365,486 A | * | 11/1994 | Schreck | 365/185.22 |
| 5,574,684 A | * | 11/1996 | Tomoeda | 365/185.04 |
| 5,768,193 A | * | 6/1998 | Lee et al. | 365/185.25 |
| 6,563,740 B2 | * | 5/2003 | Thomsen et al. | 365/185.25 |
| 6,636,440 B2 | * | 10/2003 | Maayan et al. | 365/185.25 |

* cited by examiner

*Primary Examiner*—Tan T. Nguyen
(74) *Attorney, Agent, or Firm*—Winston Hsu

(57) ABSTRACT

A refresh method for a non-volatile memory for preventing disturb phenomenon includes reading data of a memory unit of the non-volatile memory at a first time point within a predefined period and storing the data in a buffer, determining whether data of the memory unit and data of the buffer are identical at a second time point within the predefined period, so as to generate a determination result, and refreshing the memory unit according to the determination result.

7 Claims, 1 Drawing Sheet

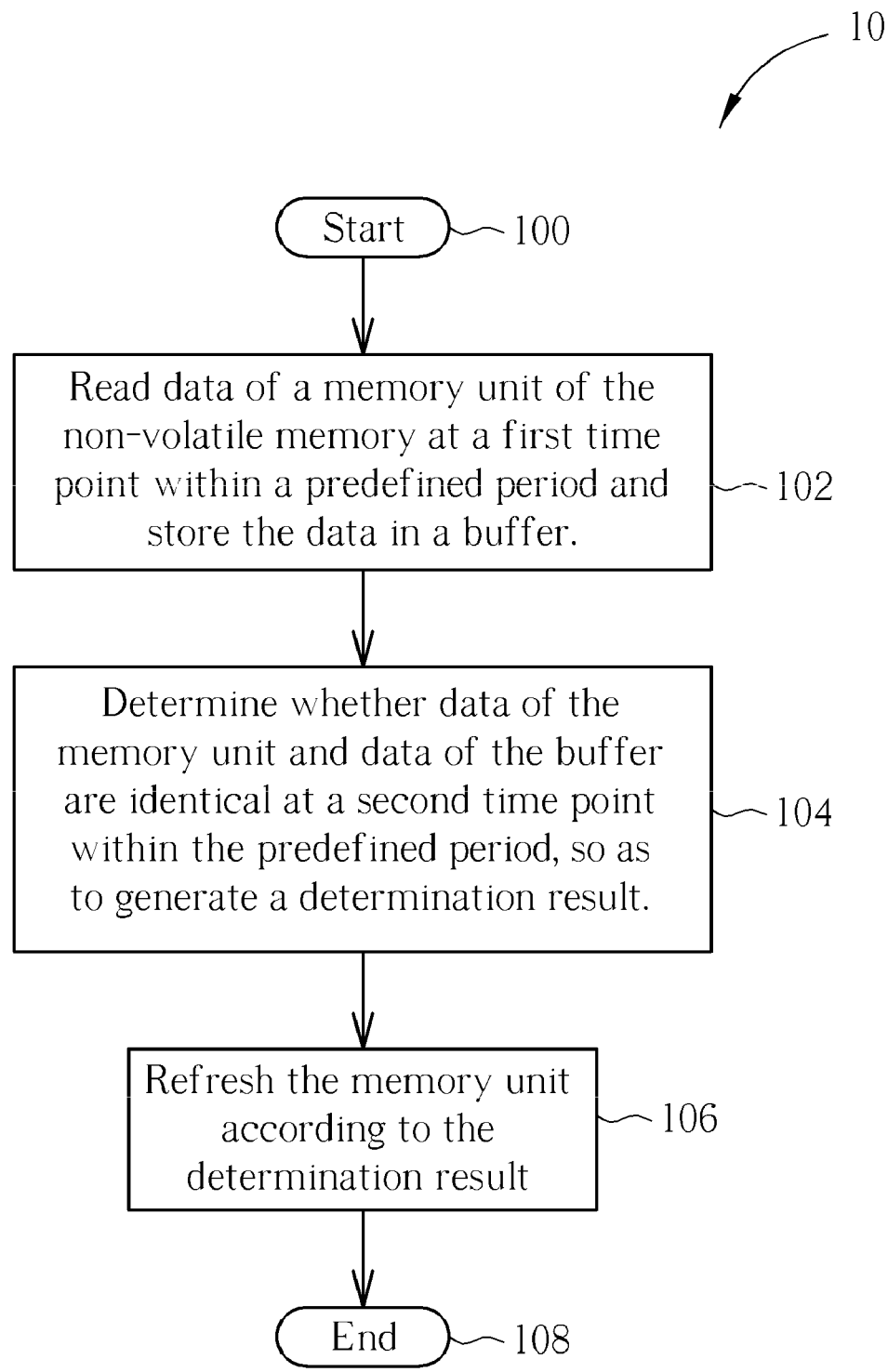
Figure

REFRESH METHOD FOR A NON-VOLATILE MEMORY

BACKGROUND OF THE INVENTION

1. Field of the Invention

The present invention is related to a refresh method for a non-volatile memory, and more particularly to a refresh method which can save operating time and effectively reduce cost.

2. Description of the Prior Art

In the modern society, the tremendous flow of information has become part of people's everyday life. For easy management of information, a memory device for storing information has become a significant subject for development in the information technology (IT) industry. This is especially obvious for a flash memory, for its low power consumption, high working speed, re-programmability, non-volatility and no moving mechanical parts. Thus, the flash memory has been playing an important role among all the memory devices.

The flash memory can be further classified into a floating gate flash memory and a split gate flash memory. Because the floating gate flash memory has merits, such as smaller area for a unit memory cell, faster access speed, and good endurance for Program and Erase commands, the floating gate flash memory is being used in portable electronic devices, computer input/output devices and many consumer devices. In a traditional floating gate flash memory, memory cells in the same P-well are set to be in the same sector, and an insulating layer is set around the P-well, such that the cells in the different sectors can be electrically isolated. The use of the insulation layer can decrease the chip area efficiency of the flash memory; that is to say, the more chip area used by the insulation layer, the less chip area can be used for the memory unit. Therefore, the area of the P-well is usually built to be larger for increasing the chip area efficiency of the memory device.

If all of the memory cells in the same P-well were further divided into multiple sectors of few memory capacities, then the sectors in the same P-well become electrically correlated. In other words, when an Erase command is issued to perform an erase function to a specific sector, the other sectors in the same P-well will be disturbed. When the disturb phenomena accumulates after certain times, data stored in the memory cells will change from "0" to "1" (on the contrary, "1" won't be changed to "0"), and therefore the memory cells need to be refreshed for avoiding the disturb phenomena. The method for refreshing the memory cells in the same P-well is to read out all the data in the same P-well and then written back, but this will need extra memory buffers, and the overall cost is then increased.

Another method in the prior art is to read all the data in the same P-well twice, and compare the data to see whether they are identical; if the two sets of data are not identical, then the memory will perform a refresh process. However, this method is time-consuming, and more complex to implement, and the cost is also increased.

SUMMARY OF THE INVENTION

It is therefore a primary objective of the claimed invention to provide a refresh method for a non-volatile memory.

The present invention discloses a refresh method for a non-volatile memory for preventing disturb phenomenon which comprises reading data of a memory unit of the non-volatile memory at a first time point within a predefined period and store the data in a buffer, determining whether data of the memory unit and the buffer are identical at a second time point within the predefined period, so as to generate a determination result, and refreshing the memory unit according to the determination result.

These and other objectives of the present invention will no doubt become obvious to those of ordinary skill in the art after reading the following detailed description of the preferred embodiment that is illustrated in the various FIGURES and drawings.

BRIEF DESCRIPTION OF THE DRAWINGS

The FIGURE illustrates a schematic diagram of a refresh flowchart of the embodiment of the present invention.

DETAILED DESCRIPTION

Please refer to the FIGURE, which illustrates a schematic diagram of a refresh flowchart 10 according to an embodiment of the present invention. The refresh flowchart 10 is applicable to a non-volatile memory, like a flash memory, and is used for avoiding the disturb phenomena. The refresh flowchart 10 comprises the following steps:

Step 100: Start.

Step 102: Read data of a memory unit of the non-volatile memory at a first time point within a predefined period and store the data in a buffer.

Step 104: Determine whether data of the memory unit and data of the buffer are identical at a second time point within the predefined period, so as to generate a determination result.

Step 106: Refresh the memory unit according to the determination result.

Step 108: End.

According to the flowchart 10, the present invention is to read data stored in a memory unit at a first time point within a predefined period of time, and store the data in a buffer. Subsequently, within the same predefined period, the present invention determines whether data in the memory unit and data in the buffer are identical, and decides whether to refresh the memory unit based on the determination result. Preferably, the first time point is prior to the second time point. In other words, the embodiment of the present invention is to read data in the memory unit in the predefined period, and makes a judgment to see whether data in the memory unit has been changed after a certain time. Then, based on the judgment, the present invention can decide whether to execute a refresh process or not. Under these conditions, the embodiment of the present invention only needs to read data in the memory unit for once via a sensor, and to determine whether data has been changed, and to decide whether to do the refresh process based on the determination result. Therefore, the embodiment of the present invention can avoid the happenings of the disturb phenomena, and the required cost is reduced.

Inside the flowchart 10, preferably, before reading data out from the memory unit, the buffer can be reset first to prevent from affecting the reading result. On the other hand, the embodiment of the present invention is to read out data via a sensor for once, and then to determine whether data has been changed. If the determination result shows data in the memory unit is not identical to data in the buffer, the embodiment of the present invention is to read out and write back data of the memory unit to refresh the memory unit. On the contrary, if the determination result shows data in the memory unit is identical to data in the buffer, then the present invention does not perform the refresh operation. Therefore, in accordance with the embodiment of the present invention, if a "disturb" phenomena occurs and makes original binary data "0" stored become binary data "1", the embodiment of the present invention is to determine whether data stored in the same memory unit keeps unchanged at two different time points, such that "disturb" can be detected in time, and the refresh function can be performed to keep data validity.

To sum up, the embodiment of the present invention is to determine whether data stored in the same memory unit keeps unchanged at two different time points, and to decide whether to refresh the memory unit based on the determination result. Therefore, the embodiment of the present invention only needs to read the data from the memory unit for once; this not only saves the time of operation, but also reduces the total cost owing to less complex implementation.

Those skilled in the art will readily observe that numerous modifications and alterations of the device and method may be made while retaining the teachings of the invention.

What is claimed is:

1. A refresh method for a non-volatile memory for preventing disturb phenomenon comprising:

reading data of a memory unit of the non-volatile memory at a first time point within a predefined period and store the data in a buffer;

determining whether data of the memory unit and data of the buffer are identical at a second time point within the predefined period, so as to generate a determination result; and refreshing the memory unit according to the determination result.

2. The refresh method of claim 1 further comprising resetting the buffer at a third time point within the predefined period.

3. The refresh method of claim 2, wherein the third time point is prior to the first time point.

4. The refresh method of claim 1, wherein the second time point is posterior to the first time point.

5. The refresh method of claim 1, wherein refreshing the memory unit according to the determination result is reading out and writing back data of the memory unit to refresh the memory unit when the determination result shows that data of the memory unit is not identical to data of the buffer.

6. The refresh method of claim 1, wherein refreshing the memory unit according to the determination result is not refreshing the memory unit when the determination result shows that data of the memory unit is identical to data of the buffer.

7. The refresh method of claim 1, wherein the non-volatile memory is a flash memory.

* * * * *